United States Patent [19]
Olla et al.

[11] Patent Number: 5,171,290
[45] Date of Patent: Dec. 15, 1992

[54] TESTING SOCKET FOR TAB TAPE

[75] Inventors: Michael A. Olla; Howard A. Moore; Daniel M. Andrews, all of Austin, Tex.

[73] Assignee: Microelectronics And Computer Technology Corporation, Austin, Tex.

[21] Appl. No.: 754,472

[22] Filed: Sep. 3, 1991

[51] Int. Cl.$^5$ .............................................. H01R 9/09
[52] U.S. Cl. ........................................ 439/71; 439/66
[58] Field of Search ............................ 439/66, 68-73, 439/485, 487; 361/381-384, 403, 406

[56] References Cited

U.S. PATENT DOCUMENTS

| | | | |
|---|---|---|---|
| 4,164,003 | 8/1979 | Cutchaw | 361/403 |
| 4,593,961 | 6/1986 | Cosmo | 439/591 |
| 4,832,612 | 5/1989 | Grabbe et al. | 439/71 |
| 4,906,194 | 3/1990 | Grabbe | 439/66 |
| 5,065,277 | 11/1991 | Davidson | 361/406 |

OTHER PUBLICATIONS

"Socket fins many SMDs," *Electronic Engineering Times*, Jun. 1990.
Fulton et al, "The Use Of Anisotropically Conductive Polymer Composites For High Density Interconnection Applications," *Proceedings of the National Electronics Packaging and Production Conference* (Nepcon) West 1990, pp. 32-46.
Yonekura, "Oriented Wire Through Connectors For High Density Contacts," *Proceedings of the National Electronics Packaging and Production Conference* (Nepcon) West 1990, pp. 57-71.
Zifcak et al, "Pinless Grid Array Connector," *6th Annual International Electronics Packaging Conference* (IEPS), Nov. 17-19, 1986, San Diego, Calif., pp. 453-464.
"Reliable Connections Under Pressure," advertisement by Shinetsu, *Electronics Packaging and Production* (EP&P), date and page unknown).
Buchoff, "Elastometric Connectors For Land Grid Array Packages," reprinted from *Connection Technology* Apr. 1989, pp. 15-18.
"Matrix MOE Elastomeric Connectors," *ETI Technical Data Sheet* by Elastomeric Technologies, Inc.
Smolley, "Button Board A New Technology," *Fourth Annual International Packaging Society Conference*, Oct. 29-31, 1984, Baltimore, Md., pp. 75-91.
Buchoff, "Solving High Density Electronic Problems With Elastomeric Connections," *Proceedings of the National Electronic Packaging and Production Conference* (Nepcon) West 1990, p. 307.
"Elastomer Sockets" by 3M/Fresh Technologies.
"Cantilever Wiper Contacts" by Textool, CTI and Azimuth.
"Stacked Washer Type Contact" by Fort Worth Interconnect.
"Pogo Pin Spring Contact Probe" by a variety of manufacturers.
"Probing ATE Trends in the 1900s," *Surface Mount Technology*, Mar. 1990, pp. 43-46.
"Testing Surface Bare Boards," *Electronic Packaging and Production*, Jun. 1990 Supplement, pp. 31-34.

*Primary Examiner*—Neil Abrams
*Attorney, Agent, or Firm*—Fulbright & Jaworski

[57] ABSTRACT

A testing and burn in socket compatible with the high density test pads located at small pitches devices on a TAB tape. A TAB tape carrier for supporting the TAB tape and a test circuit board having contact pads for electrical communication with the test pads. An alignment fixture positioned between the tape carrier and circuit board and including an opening in alignment between the test pads and the contact pads. A metal in elastomer matrix is positioned in the opening for providing electrical communication between the test pads and the contact pads. A block may be positoned in the openings and contain a plurality of straight parallel electrically conductive pins aligned with the matrix for high frequency tests.

16 Claims, 4 Drawing Sheets

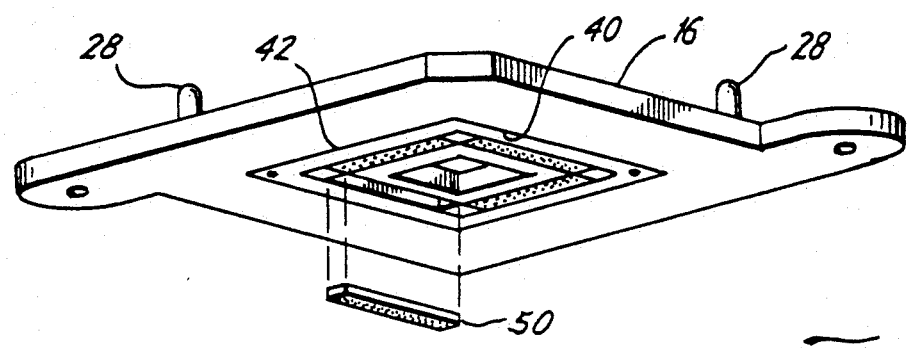
Fig. 4
Fig. 5
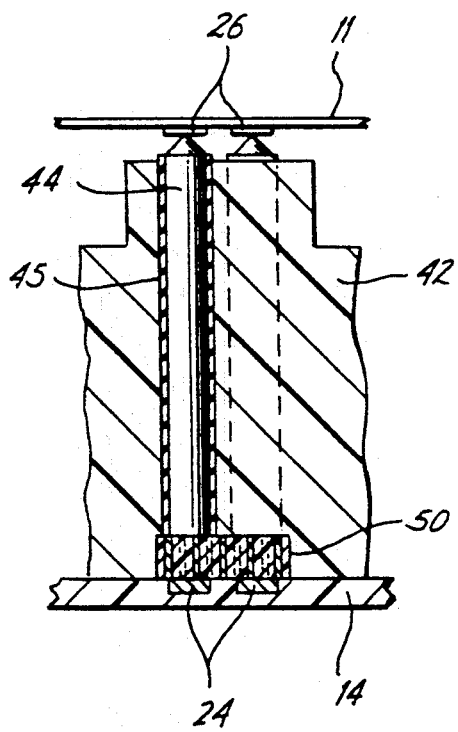
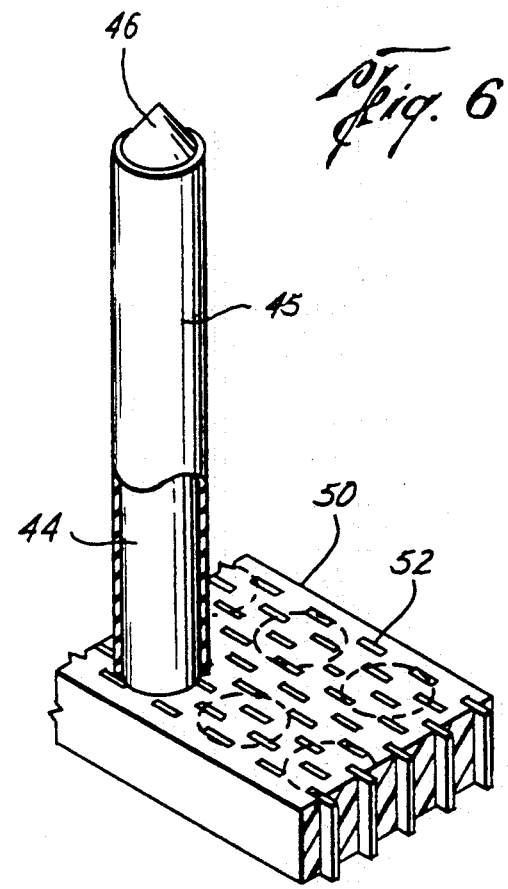
Fig. 6

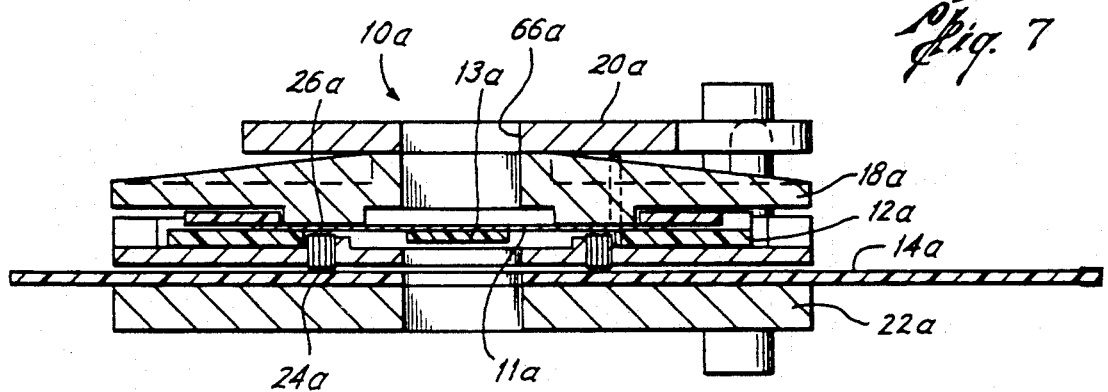
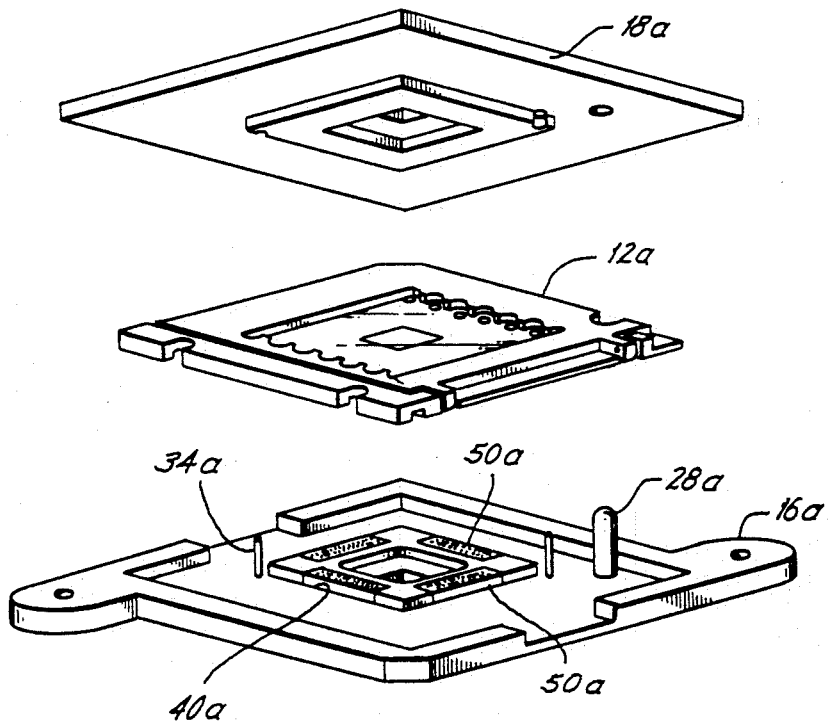

TESTING SOCKET FOR TAB TAPE

BACKGROUND OF THE INVENTION

As the use of chip-on-tape increases and becomes a part of high volume manufacturing operations, the need for improved test and burn-in fixtures will grow larger. The high lead count, for example, 300 to 600, and smaller test pad geometries, for example, down to 0.010 inch pitch for tape-automated-bonding (TAB) tape devices, has created a need for very fine pitch and high lead count TAB test sockets. Present commercial sockets are extremely expensive, require large amounts of tooling changes for custom configurations, have long lead times for prototype fabrication, and are very delicate in nature.

The present invention is directed to a test and burn-in socket for TAB tape which is low cost, easily customized and ruggedly designed.

SUMMARY

The present invention is directed to a testing socket for TAB tape which has high lead count test pads located at small pitches. The socket includes a TAB tape carrier for supporting the TAB tape, and a test circuit board having contact pads for electrical communication with the test pads on the TAB tape. An alignment fixture is positioned between the tape carrier and the circuit board and includes alignment means for aligning the tape carrier and thus the TAB tape with test circuit board. The alignment fixture includes one or more openings in alignment between the test pads and the contact pads. A metal in elastomer matrix is positioned in the openings and includes a plurality of parallel electrical conductors having a smaller cross section and a pitch spacing less than the cross section and pitch of the test pads for providing electrical communication between the test pads and the contact pads. A fixture top is positioned adjacent the tape carrier for backing up the test pads and pressure means are positioned on opposite sides of the socket for holding the test pads and contact pads in electrical contact.

Still a further object of the present invention is wherein the matrix extends outwardly from the top and bottom of the alignment fixture.

Still a further object of the present invention is wherein the alignment means includes a plurality of projections and coacting recesses.

Yet a still further object of the present invention is wherein the circuit board, alignment fixture and fixture top include an opening aligned with the TAB tape for temperature control.

Yet a still further object of the present invention is the provision of a block positioned in the openings between the test pads and the contact pads and including a plurality of straight parallel electrically conductive pins positioned in the block, said pins aligned with and contacting one of the test pads and the contact pads. Preferably, the block is metal and the pins are insulated from the block for high frequency testing. And preferably each of the pins contacts one of the test pads.

Yet a still further object of the present invention is wherein the pins and the matrix are aligned in series. The cross-sectional areas of the pins are greater than the cross-sectional areas of the electrical conductors. Preferably, the matrix extends outwardly from the align-ment fixture and the pins extend outwardly from the alignment fixture.

Other and further objects, features and advantages will be apparent from the following description of presently preferred embodiments of the invention, given for the purpose of disclosure and taken in conjunction with the accompanying drawings.

BRIEF DESCRIPTION OF THE DRAWINGS

FIG. 4 is a perspective elevational view of the alignment fixture of the present invention, FIG. 5 is an enlarged fragmentary cross-sectional view illustrating the electrical connection in the socket of FIGS. 1-4, FIG. 6 is an enlarged fragmentary elevational view, in perspective, of part of the structure of FIG. 5, FIG. 7 is a cross-sectional view of another embodiment of the present invention, and FIG. 8 is an exploded, perspective elevational view of some of the parts of the testing socket of FIG. 7.

DESCRIPTION OF THE PREFERRED EMBODIMENT

Figure 1:
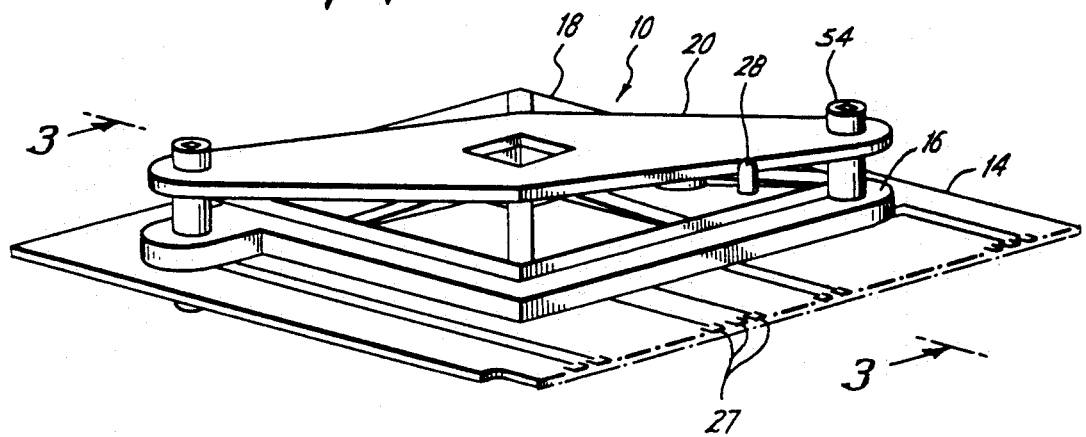
FIG. 1 is an elevational perspective view of one embodiment of the testing socket of the present invention.
Figure 3:
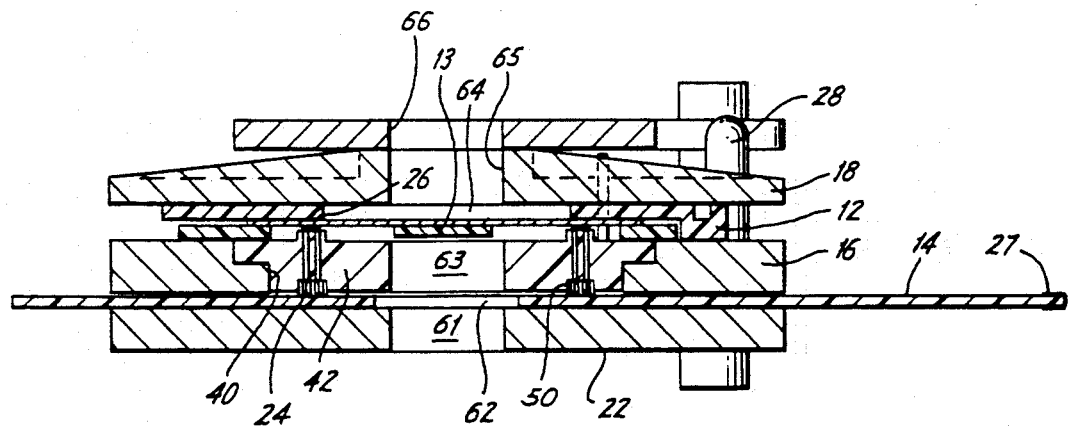
FIG. 3 is a cross-sectional view taken along the line 3—3 of FIG. 1.
Figure 2:
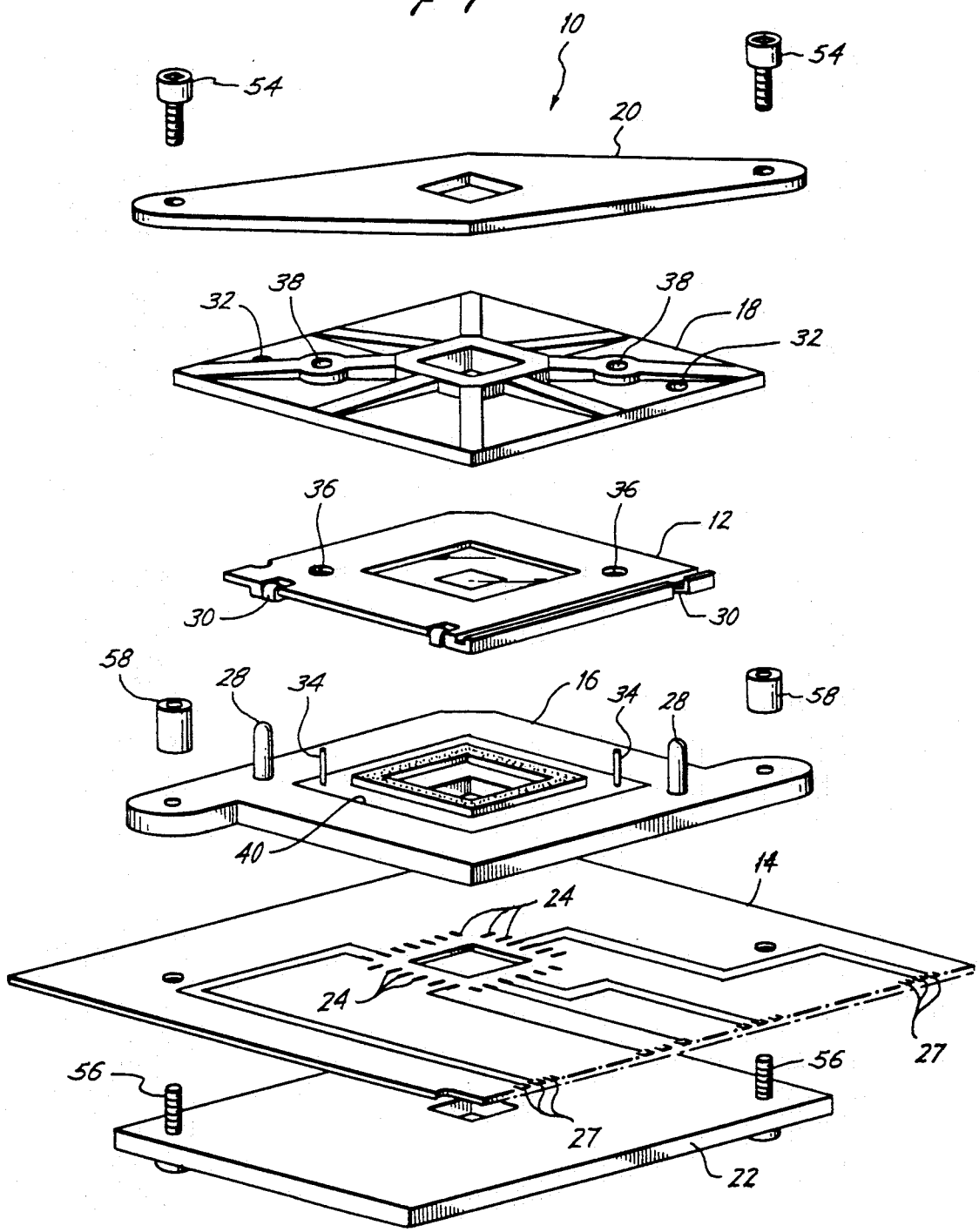
FIG. 2 is an exploded, perspective elevational view of the socket of FIG. 1.

Referring now to the drawings, and particularly to FIGS. 1, 2 and 3, the reference numeral 10 generally indicates the testing socket of the present invention and generally includes a TAB tape carrier 12 for supporting a TAB tape, a test circuit board 14 having contact pads 24 for electrical communication with test pads 26 on the TAB tape 11 connected to an integrated circuit 13, an alignment fixture 16 positioned between the tape carrier 12 and the circuit board 14 including alignment means for aligning the tape carrier 12 with the test circuit board 14, a fixture top 18, for backing up the tape carrier 12, and pressure means positioned on opposite sides of the circuit, such as pressure ends 20 and 22.

The TAB tape carrier 12 may be a standard Jedec type slide carrier. A large variety of TAB tape designs can be handled within this standardized carrier 12. The various TAB tape designs may have varying high lead test pad counts, for example, 300 to 600, and small test pad geometries, down to 0.010 inch pitch. As the use of chip on tape increases and becomes a part of high volume manufacturing operations, the need for improved test and burn-in fixtures will grow larger. The present invention is directed to a low cost, custom configurable, sturdy, high density socket for TAB tape in a slide carrier format. The use of the standardized slide carrier 12 also creates and advantage from a handling and processing standpoint. The number of times that a piece of TAB tape must be handled through insertion and removal from a testing socket is reduced. That is, the TAB tape may be inserted into the carrier 12 for electrical testing, and can be also utilized for burn-in and subsequent retest. A standard process would normally require three separate insertions and removal of the TAB tape from the socket.

The test circuit board 14 includes a plurality of contact pads 24, each of which is aligned with one of the test pads 26 (FIGS. 3 and 5) on the TAB tape 11. That is, the contact pads 24 are aligned with and match one of the test pads 26 in a vertical direction. Therefore, the contact pad 24 pattern matches the pattern of the test pads 26 on the TAB tape 11. The test circuit board 14 is provided with connection pads 27 connected to the contact pads 24 in a configuration to allow connection to a test harness cable or a burn-in mother board through a conventional card edge connector. This simplifies the task of interfacing to either a tester or a burn-in board. Therefore, the test circuit board 14 transforms the TAB tape test pad pattern to a contact pattern compatible with standard card edge connectors.

The alignment fixture 16 provides alignment between the test pads 26 of the TAB tape 11 and the contact pads 24 of the test circuit board 14 while handling the TAB tape in a standardized Jedec type slide carrier 12. The tape 11 is preferably used in carriers 12 having the floating tape alignment option and two sets of alignment projections. This allows coarse and fine alignment of the carrier 12 and the tape 11 relative to the alignment fixture 16. The alignment fixture 16 has two round projections 28 for coacting with openings 30 in the carrier 12 and openings 32 in the top fixture 18 for providing coarse alignment of the carrier 12 relative to the fixture 16. In addition, two diagonal locator projections 34 project through the tape 11 and through openings 36 in the carrier 12 and openings 38 in the top fixture 18 for fine alignment of the tape 11. The carrier 12 and the fixture top 18 slide down vertically on the alignment projections 28 and 34 preventing relative transverse motion between the tape 11 and the alignment fixture 16 when assembled.

Referring now to FIGS. 2, 3, 4 and 5, the alignment fixture 16 includes one or more openings 40 which are in alignment between the test pads 26 and the contact pads 24. The opening 40 holds electrical conductor means for making electrical contact between the test pads 26 and the contact pads 24. In the embodiment of FIGS. 1-7, a block 42 is positioned in the opening 40 and a plurality of straight parallel electrically conductive pins are positioned in the block 42. The pins 44 are aligned with and contact either test pads 26 or the contact pads 24, here shown as having pointed ends 46 and each pin end 46 contacting one of the test pads 26. While the pins 44 may be of any suitable conductive material, preferably they are hardened, stainless steel pins which have been plated with rhodium. The ends 46 of the pins 44 extend outwardly from the block 42 a short distance, such as 0.020 inches. The pins 44 may be simple, straight pins, easily fabricated from wire material. High density is achieved because of the straight pin 44 configuration. Because the block 42 may be a simple array of straight through-holes, the pitch of the ends 46 may be reduced below that achievable with cantilevered type probes.

While the pins 44 may be positioned in a non-electrically conductive block 42, the pins are useful for high frequency testing by enclosing the pins in an insulation 45 and in which the block 42 is a grounded metal block. That is, the pins 44 are then configured for high frequency application. The pins 44 provide a lower impedance environment by coating the pins with the dielectric coating 45 and using the conductive block 42 for shielding.

While the pins 44 could be used as the only paths of electrical communication between the test pads 26 and the contact pads 24, it is preferable to provide a spring action and compliancy in the electrical path between the pads 26 and pads 24 in order to provide a good electrical contact and also to compensate for any uneven surfaces. Therefore, a metal elastomer matrix 50 is positioned in the block 42 in alignment between the test pads 26 and the contact pads 24. The matrix 50 includes a plurality of parallel electrical conductors, such as gold, having a smaller cross-section than the test pads 26 and a pitch spacing less than the pitch of the electrical pad 26. The elastomer may be a silicon rubber. Thus, when the matrix 50 is sandwiched between the ends of the pins 44 and the contact pads 24, electrical contact is made only in a vertical direction between the pins 44 and their aligned pads 24. That is, because of the size and spacing of the conductors 52 they will contact only one of the pins 44 and pads 24, but more than one of the conductors 52 may make contact thereby providing a redundant connection. The metal in elastomer matrix is commercially available from Elastomeric Technologies, Inc. of Hatboro, Pa. For purposes of illustration only, the test pads 26 are spaced on staggered pitch spacing of 0.010 inches and have a surface size of 0.5 mils by 2 mils and the contact pads 24 are similarly spaced and aligned with the test pads 26. The diameter of the pins 44 may be 0.015 to 0.030 inches. The electrical conductors 52 are rectangular in cross section and may be 0.002 inches by 0.0005 inches and are spaced at a longitudinal and transverse pitch of 0.004 inches.

The metal in elastomer matrix 50 extends outwardly from the block 42 a short distance, such as 8 mils to 10 mils, or 15% of its thickness. When the socket 10 is compressed, as will be more fully described hereinafter, the elastomer matrix 50 is compressed slightly and applies a uniform pressure to the electrical conductors 52 within the elastomer insulator while supplying conformance to uneven surfaces. The small pitch nature of the matrix within the elastomer provides for redundant contacts at each of the locations where a connection is made. It is to be noted that because of the unique nature of the matrix 50, the matrix can be used for establishing electrical communication between a large variety of pad configurations and pad pitches. In addition, it is noted that both the pins 44 and the matrix 50 provide electrical contacts with a high degree of sturdiness. That is, both the pins 44 and electrical conductors 52 are well protected and supported and damage is greatly reduced as compared to other available sockets.

The fixture top 18, as best seen in FIGS. 1-3, backs up and supports the carrier 12 and thus backs up the test pads 26. Suitable pressure means are positioned on opposite sides of the socket 10 for holding the test pads 26 and contact pads 24 in good electrical contact. For example, end plates 20 and 22 are provided which span the fixture top 18, the carrier 20, the fixture 16 and the circuit board 14, pressing them together by suitable means such as screws 54 and 56 engaging nuts 58.

Referring now to FIGS. 1, 2 and 3, it is to be noted that openings are provided in the socket 10 above and below the integrated circuit 13. Thus, openings 61, 62, 63, 64, 65 and 66, are provided in end 22, circuit board 14, adjustment fixture 16, carrier 12, fixture top 18, and end 20, respectively. This leaves integrated circuit 13 more fully exposed to the outside of the socket 10. This facilitates eating or cooling for testing over a temperature range. This also allows burn-in to be provided by a variety of techniques including convection heating, liquid emersion, or gas impingement.

The embodiment shown in FIGS. 1 through 6 provides a testing socket which can be modified to have the ability to economically reconfigure the socket to accommodate different TAB tape test patterns, both in number of test pads and in their location. That is, for a different TAB tape test pad patterns, the block 42 would be replaced with a different block having pins 44 positioned for alignment with the different TAB tape test patterns and the test circuit board 14 would be replaced with a test circuit board having contact pads aligned with the test pads on the different TAB tape.

Other and further modifications of the present invention may be provided. In FIGS. 7 and 8, another embodiment of the present invention is best seen wherein like parts to those shown in FIGS. 1-6 are similarly numbered with the addition of the suffix "a".

In the embodiment of FIGS. 7 and 8, the test circuit board 14a includes contact pads 24a aligned with the test pads 26a on the TAB tape 11 in the carrier 12a. However, in providing communication between the test pads 26a and the contact pads 24a, the straight parallel electrically conductive pins are omitted. Instead, the metal in elastomer matrix 50a is positioned in recesses 40a and extend upwardly and downwardly from both sides of the alignment fixture 16a and provides the only electrical communication between the test pads 26a and the contact pads 24a. While this particular embodiment is not as suitable for high frequency applications as the embodiment of FIGS. 1-6, it can be reconfigured and adapted for different TAB tape test patterns with less cost than the embodiment of FIGS. 1-6. That is, all that is required to modify the testing socket 10a to test a different TAB configuration of test pads is that the contact pad 24a pattern on the test circuit board 14a be provided to match the pattern of the test pads 26a on the TAB tape 11a. That is, the fine pitch nature of the electrical conductors in the matrix 50a will provide electrical communication therethrough for varying types of TAB tape test pads. This feature greatly reduces the cost to tool a new socket for a custom or non-standard TAB test pad arrangement.

The present invention, therefore, is well adapted to carry out the objects and attain the ends and advantages mentioned as well as others inherent therein. While presently preferred embodiments of the invention have been given for the purpose of disclosure, numerous changes in the details of construction and arrangement of parts will be readily apparent to those skilled in the art and which are encompassed within the spirit of the invention and the scope of the appended claims.

What is claimed is:

1. A testing socket for TAB tape which has high lead test pads located at small pitches comprising,
   a TAB tape carrier for supporting the TAB tape,
   a test circuit board having contact pads for electrical communication with the test pads on the TAB tape,
   an alignment fixture positioned between the tape carrier and the circuit board and including alignment means for aligning the tape carrier and the TAB tape with the test circuit board,
   said alignment fixture including one or more openings in alignment between the test pads and the contact pads,
   a metal in elastomer matrix positioned in the openings including a plurality of parallel electrical conductors having a smaller cross section than the test pads and pitch spacing less than the pitch of the test pads for providing electrical communication between the test pads and the contact pads;
   a fixture top positioned adjacent the tape carrier for backing up the test pads,
   pressure means positioned on opposite sides of the socket for holding the test pads and contact pads in electrical contact,
   a block positioned in the opening between the test pads and the contact pads, and
   a plurality of straight parallel electrically conductive pins positioned in the block, said pins aligned with and contacting one of the test pads and the contact pads wherein said block is metal and the pins are insulated from the block for high frequency testing.

2. The apparatus of claim 1 wherein the matrix extends outwardly from the top and bottom of the alignment fixture.

3. The apparatus of claim 1 wherein the alignment means includes a plurality of projections and contacting recesses.

4. The apparatus of claim 1 wherein the circuit board, alignment fixture, and fixture top each include an opening aligned with the TAB tape for temperature control.

5. The apparatus of claim 1 wherein each of the pins contact one of the test pads.

6. The apparatus of claim 1 wherein the pins and matrix are aligned in series.

7. The apparatus of claim 6 wherein the cross-sectional area of the pins are greater than the cross-sectional area of the electrical conductors.

8. The apparatus of claim 7 wherein the matrix extends from one side of the alignment fixture and the pins extend from the other side of the alignment fixture.

9. A testing socket for TAB tape which has high lead test pads located at small pitches comprising,
   a TAB tape carrier for supporting the TAB tape,
   a test circuit board having contact pads for electrical communication with the test pads on the TAB tape,
   an alignment fixture positioned between the tape carrier and the circuit board and including alignment means for aligning the tape carrier and the TAB tape with the test circuit board,
   said alignment fixture including one or more openings in alignment between the test pads and the contact pads,
   a metal in elastomer matrix positioned in the opening including a plurality of parallel electrical conductors having a smaller cross section than the test pads and pitch spacing less than the pitch of the test pads for providing electrical communication between the test pads and the contact pads;
   a fixture top positioned adjacent the tape carrier for backing up the test pads,
   pressure means positioned on opposite sides of the socket for holding the test pads and contact pads in electrical contact,
   a block positioned in the opening between the test pads and the contact pads, and
   a plurality of straight parallel electrically conductive pins positioned in the block, said pins aligned with and contacting gone of the test pads and the contact pads wherein the pins and matrix are aligned in series.

10. The apparatus of claim 9 wherein the matrix extends outwardly from the top and bottom of the alignment fixture.

11. The apparatus of claim 9 wherein the alignment means includes a plurality of projections and coacting recesses.

12. The apparatus of claim 9 wherein the circuit board, alignment fixture, and fixture top each include an opening aligned with the TAB tape for temperature control.

13. The apparatus of claim 9 wherein the block is metal and the pins are insulated from the block for high frequency testing.

14. The apparatus of claim 9 wherein each of the pins contacts one of the test pads.

15. The apparatus of claim 9 wherein the cross-sectional area of the pins are greater than the cross-sectional area of the electrical conductors.

16. The apparatus of claim 9 wherein the matrix extends from one side of the alignment fixture and the pins extend from the other side of the alignment fixture.

* * * * *

UNITED STATES PATENT AND TRADEMARK OFFICE
CERTIFICATE OF CORRECTION

PATENT NO. : 5,171,290

DATED : Dec. 15, 1992

INVENTOR(S) : Michael A. Olla et al.

It is certified that error appears in the above-identified patent and that said Letters Patent is hereby corrected as shown below:

Column 4, line 61, delete "eating" and replace it with -- heating --

Column 6, line 15, delete "contacting" and replace it with -- coacting --

Signed and Sealed this

Second Day of November, 1993

Attest:

BRUCE LEHMAN

Attesting Officer

Commissioner of Patents and Trademarks